US009502487B2

United States Patent
Jeong et al.

(10) Patent No.: US 9,502,487 B2
(45) Date of Patent: Nov. 22, 2016

(54) ORGANIC ELECTROLUMINESCENT DEVICE AND REPAIRING METHOD THEREOF

(71) Applicant: LG Display Co., Ltd., Seoul (KR)

(72) Inventors: Jae-Hun Jeong, Incheon (KR); Ki-Sul Cho, Gumi-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/463,175

(22) Filed: Aug. 19, 2014

(65) Prior Publication Data

US 2015/0144904 A1 May 28, 2015

(30) Foreign Application Priority Data

Nov. 25, 2013 (KR) ........................ 10-2013-0143732

(51) Int. Cl.
| | | |
|---|---|---|
| *H01L 27/32* | (2006.01) | |
| *H01L 51/52* | (2006.01) | |
| *H01L 51/56* | (2006.01) | |

(52) U.S. Cl.
CPC ......... *H01L 27/3272* (2013.01); *H01L 27/326* (2013.01); *H01L 51/5209* (2013.01); *H01L 51/5237* (2013.01); *H01L 27/3262* (2013.01); *H01L 51/56* (2013.01); *H01L 2227/323* (2013.01); *H01L 2251/568* (2013.01)

(58) Field of Classification Search
CPC ................ H01L 2227/323; H01L 2251/568; H01L 27/326; H01L 27/3262; H01L 27/3272; H01L 51/5203; H01L 51/5237; H01L 51/56
USPC ................................................ 313/498–512
See application file for complete search history.

(56) References Cited

U.S. PATENT DOCUMENTS

| | | | | |
|---|---|---|---|---|
| 2003/0186489 | A1* | 10/2003 | Ishikawa | G02F 1/136213 438/155 |
| 2007/0046193 | A1* | 3/2007 | Rhee | H01L 27/3244 313/506 |
| 2007/0120476 | A1* | 5/2007 | Park | H01L 27/1214 313/506 |
| 2007/0195248 | A1* | 8/2007 | Huh | G02F 1/13624 349/139 |
| 2007/0263164 | A1* | 11/2007 | Kumagai | H01L 27/3246 349/156 |
| 2008/0180363 | A1 | 7/2008 | Jeong et al. | |
| 2009/0045401 | A1* | 2/2009 | Yamazaki | H01L 29/04 257/57 |
| 2009/0102759 | A1 | 4/2009 | Kawabe | |
| 2010/0012943 | A1* | 1/2010 | Park | H01L 27/1251 257/66 |

(Continued)

FOREIGN PATENT DOCUMENTS

| | | |
|---|---|---|
| EP | 1970960 A2 | 9/2008 |
| GB | 2489939 A | 10/2012 |

(Continued)

*Primary Examiner* — Donald Raleigh
*Assistant Examiner* — Kevin Quarterman
(74) *Attorney, Agent, or Firm* — Dentons US LLP

(57) ABSTRACT

An organic electroluminescent device includes a substrate including a plurality of pixel regions each having a light emission region and an element region; a plurality of thin film transistors (TFTs) including at least one switching TFT and at least one driving TFT in each element region; a planarization layer on the plurality of TFTs; a first electrode on the planarization layer and including first to third portions connected to one another, wherein the first and second portions are at each pixel region, and the third portion is at a neighboring pixel region; an organic light emitting layer on the first electrode; and a second electrode on the organic light emitting layer, wherein an end of the third portion overlaps the driving TFT of the neighboring pixel region.

9 Claims, 6 Drawing Sheets

(56) References Cited

U.S. PATENT DOCUMENTS

2010/0133517 A1* 6/2010 Lee .................. H01L 51/5052
257/40
2013/0113774 A1* 5/2013 Choi ...................... G09G 3/32
345/211

FOREIGN PATENT DOCUMENTS

WO 2009/133388 A1 11/2009
WO 2011/013522 A1 2/2011

* cited by examiner

ORGANIC ELECTROLUMINESCENT DEVICE AND REPAIRING METHOD THEREOF

The present application claims the priority benefit of Korean Patent Application No. 10-2013-0143732 filed in the Republic of Korea on Nov. 25, 2013, which is incorporated by reference in its entirety for all purposes as if fully set forth herein.

BACKGROUND

1. Field of the Disclosure

The present disclosure relates to an organic electroluminescent device (OELD), and particularly, an organic electroluminescent device configured such that when a pixel having a bright spot defect or dark spot defect is identified, the defective pixel can be operated identically with a neighboring pixel, and a repairing method thereof.

2. Discussion of the Prior Art

An organic electroluminescent device, which is a flat panel display, has properties of high brightness and low driving voltage. Further, because the organic electroluminescent device is a self-luminous type device, it has advantages of high contrast ratio, thin profile, fast response time of about several microseconds, no limit to viewing angle, stability at low temperature, and simple manufacturing and design of driving circuitry because the device operates at a low voltage of DC 5V to 15V.

Accordingly, the organic electroluminescent device having the above advantages is recently used for various electronic IT (information technology) devices such as TVs, monitors, and mobile phones.

The organic electroluminescent device includes an array element and an organic light emitting diode (OLED). The array element includes a switching thin film transistor (TFT) and at least one driving TFT connected to the organic light emitting diode. The organic light emitting diode includes a first electrode connected to the driving TFT, an organic light emitting layer, and a second electrode.

The organic electroluminescent device may display full color images using organic light emitting materials emitting red, green, and blue, respectively. Alternatively, the organic electroluminescent device may display full color images using organic light emitting materials all emitting white with red, green, and blue color filter patterns in respective pixel regions.

However, there is a defect in that a property of the driving TFT is degraded or an internal short circuit of the TFT occurs during manufacturing signal lines, switching TFTs, and driving TFTs, and thus the TFT does not operate normally.

When the TFT is not operating normally, current does not flow to the organic light emitting diode, and a pixel having the TFT becomes a dark spot. When there is a short-circuit between source and drain electrodes of the driving TFT, a driving voltage is directly applied to the drain electrode regardless of the driving TFT being turned on/off, and thus a pixel having the TFT is in on state at all times and becomes a bright spot.

In the case of the dark spot, because it is impossible to repair the dark-spot pixel, this pixel remains as it is. In the case of the bright spot, disconnection between the driving TFT and the first electrode and disconnection between the driving TFT and the switching TFT are made by a laser cutting method. Further, the first and second electrodes of the organic light emitting diode are connected by a welding method, whereby the pixel becomes a dark spot.

In this regard, the bright spot is relatively more visible to a user, and thus even though there may not be many bright spots occur in the display device, the display device may be disqualified and does not become a final product. On the other hand, dark spots are relatively less visible by a user. Particularly, about 10 to 20 dark spots in the display device are hardly visible by a user. Accordingly, in the case that the bright spot exists, the process of changing the bright spot into dark spot is conducted.

Recently, display devices of high resolution such as full HD (high definition) or UHD (ultra-high definition) are available, and users are growing more and more interested in display quality. Accordingly, a product having 5 or less spot defects is required.

However, there may have been no methods to repair the dark spot due to the nature of the display device. Further, because hundreds of thousands of pixels exist[s] in a display device, failure cost to manufacture the display device having all the pixels non-defective increases a lot, and thus production cost increases.

SUMMARY OF THE INVENTION

Accordingly, the present invention is directed to an organic electroluminescent device that has a structure to repair a pixel with a dark spot defect so it can be normally operated, and a repairing method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an organic electroluminescent device comprising: a substrate; a plurality of pixel regions on the substrate; an element region within a first pixel region including a switching thin film transistor (TFT), a first driving TFT, and a storage capacitor; an emission region within the first pixel region adjacent to the element region and including an emission layer; a planarization layer covering the element region and the emission region, and having a substantially flat surface; a first electrode formed on the planarization layer to contact a first surface of the emission layer; and a second electrode contacting a second surface of the emission layer, wherein a portion of the first electrode overlaps a second driving TFT in an element region of a second pixel region adjacent to the first pixel region.

In another aspect, an organic electroluminescent device comprises: a first substrate including a plurality of pixels each including a switching thin film transistor (TFT), a driving TFT connected to the switching TFT, and an organic light emitting diode (OLED) connected to the driving TFT; and a second substrate encapsulating the plurality of pixels; wherein a first electrode formed on a planarization layer contacts a first OLED in a first pixel, and wherein the first electrode overlaps a second driving TFT in a second pixel.

In another aspect, a method of repairing an organic electroluminescent device comprises: disconnecting electrical connections of a first driving thin film transistor (TFT) from a switching TFT and a power line in an element region of a first pixel; and connecting a first electrode of the first pixel to a second driving TFT of a second pixel adjacent to the first pixel.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE ILLUSTRATED EMBODIMENTS

Reference will now be made in detail to exemplary embodiments, examples of which are illustrated in the accompanying drawings.

Figure 1:
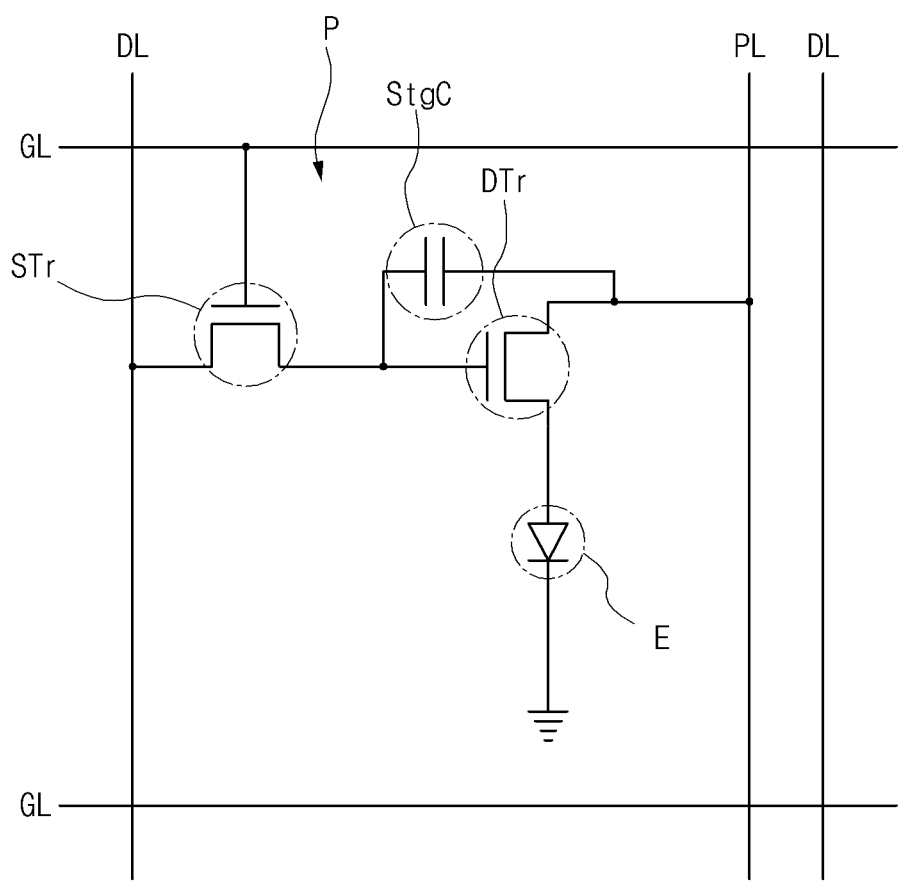
FIG. 1 is a circuit diagram of a pixel of an organic electroluminescent device according to an exemplary embodiment of the present invention.

FIG. 1 is a circuit diagram of a pixel of an organic electroluminescent device according to an exemplary embodiment of the present invention.

Referring to FIG. 1, the pixel P of the organic electroluminescent device includes a switching TFT STr, a driving TFT DTr, a storage capacitor StgC, and an organic light emitting diode E.

A gate line GL is formed along a first direction, and a data line DL is formed along a second direction crossing the first direction. The gate and data lines GL and DL, respectively, cross each other to define the pixel P. A power line PL is spaced apart from the data line DL and supplies a power voltage to the pixel P.

The switching TFT STr is located near the crossing portion of the gate and data lines GL and DL, and the driving TFT DTr is electrically connected to the switching TFT STr.

A terminal i.e., a first electrode of the organic light emitting diode E is connected to a drain electrode of the driving TFT DTr. The other terminal i.e., a second electrode of the organic light emitting diode E is grounded. A source electrode of the driving TFT DTr is connected to the power line PL.

The storage capacitor StgC is connected between the gate electrode and the source electrode of the driving TFT DTr.

When a gate signal is applied through the gate line GL, the switching TFT STr is tuned on, a data signal is applied through the data line DL and the switching TFT STr to the gate electrode of the driving TFT DTr, and the driving TFT DTr is turned on. Accordingly, a current flows through the driving TFT DTr to the organic light emitting diode (OLED) E and driving the OLED to emit light.

The current is determined according to the data signal applied to the driving TFT DTr, and thus, may vary. Driving the organic light emitting diode (OLED) E with various currents alters the amount of light emitted, and accordingly, allows the OLED to output gray scales. The storage capacitor StgC functions to store the gate voltage of the driving TFT DTr, and thus, the current flowing to the organic light emitting diode (OLED) E can be maintained until the next frame refresh.

As described above, the pixel has one switching TFT and one driving TFT. However, at least one other TFT may be further included in the pixel as needed, and, the circuit design of the pixel may be changed.

Figure 2:
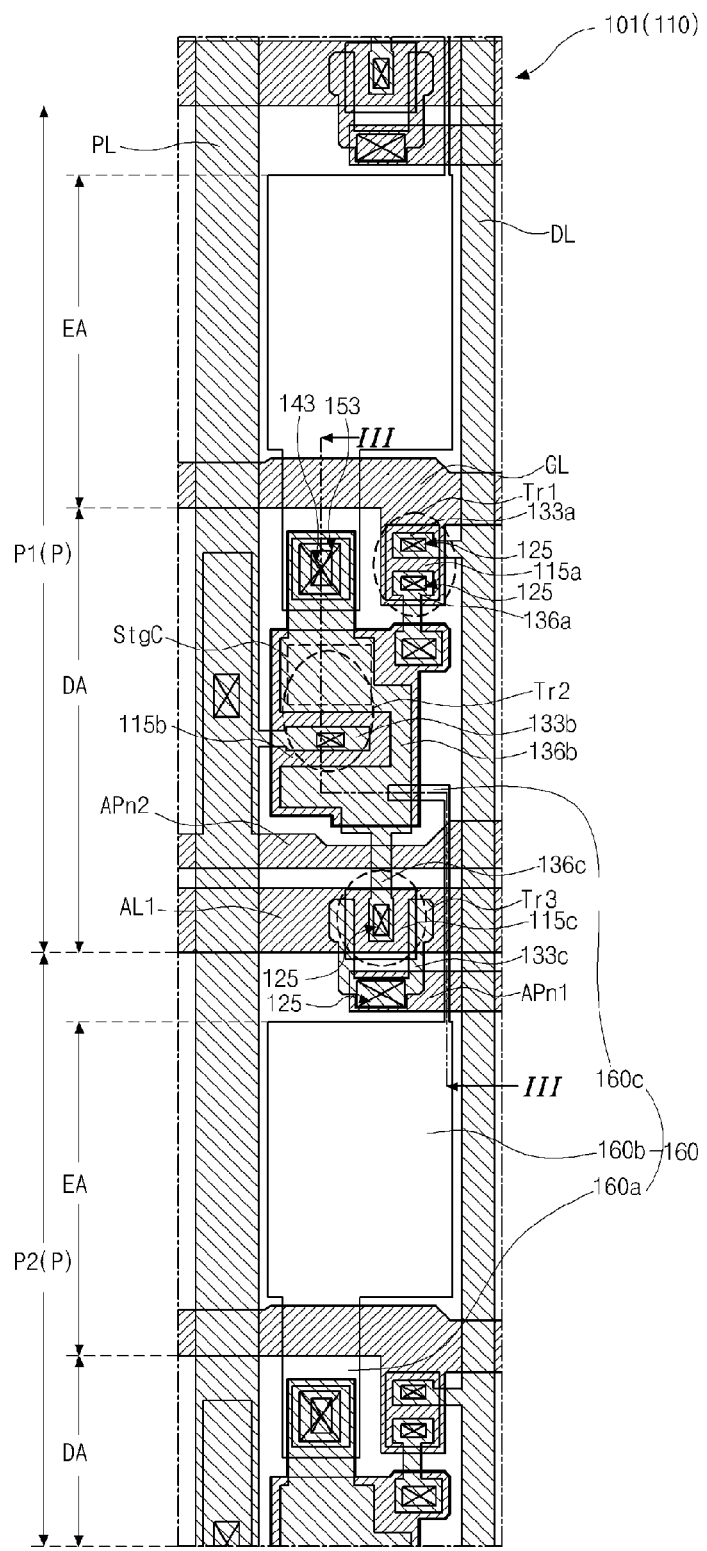
FIG. 2 is a plan view illustrating a part of a display region of the organic electroluminescent device according to the exemplary embodiment of the present invention.
Figure 3:
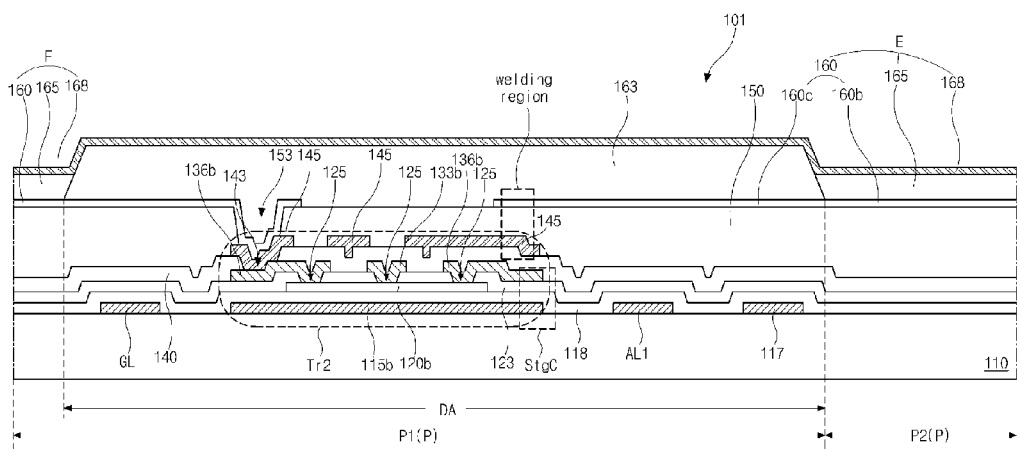
FIG. 3 is a cross-sectional view taken along a line III-III of FIG. 2.

FIG. 2 is a plan view illustrating a part of a display region of the organic electroluminescent device according to an embodiment of the present invention, and FIG. 3 is a cross-sectional view taken along line III-III of FIG. 2. In FIG. 2, two adjacent neighboring pixel regions along an extension direction of the data line DL are shown. For the purpose of explanations, a region where the switching TFT, the driving TFT, and an auxiliary driving TFT are formed in each pixel region is referred to as element region DA. A region where the organic light emitting diode E is formed is referred to as a light emission region EA. The pixel region P at the upper portion is referred to as first pixel region P1, and the pixel region P at the lower portion is referred to as second pixel region P2.

In this embodiment, the pixel region P of the organic electroluminescent device 101 has the three TFTs i.e., the switching TFT Tr1, the driving TFT Tr2, and the auxiliary driving TFT Tr3. However, it should be understood that the pixel region P has at least two TFTs i.e., the switching TFT Tr1 and the driving TFT Tr2, or the switching and driving TFTs Tr1 and Tr2, and at least two auxiliary driving TFTs.

Referring to FIGS. 2 and 3, the organic electroluminescent device 101 includes a first substrate 110 having the switching and driving TFTs Tr1 and Tr2 and the organic light emitting diode E thereon, and a second substrate (not shown) for encapsulating the pixels including the organic light emitting diode E. The second substrate may be replaced with a film, an inorganic insulating layer, or an organic insulating layer.

On the substrate 110, the gate line GL and the data line DL are formed crossing each other.

A first auxiliary line AL1 is formed in parallel with the gate line GL, and a power line PL and a second auxiliary line (not shown) are formed in parallel with the data line DL.

In this embodiment, a region surrounded by the data line DL, the power line PL, and the first auxiliary line AL1 is the pixel region P. The gate line GL is located at a boundary portion between the element region DA and the light emission region EA. Alternatively, the positions of the gate line GL and the first auxiliary line AL1 may change, and in this case, a region surrounded by the data line DL, the power line PL, and the gate line GL may be the pixel region P.

In the element region DA, the switching TFT Tr1 is connected to the gate and data lines GL and DL, the driving TFT Tr2 is connected to the switching TFT Tr1 and the power line PL, and the auxiliary driving TFT Tr3 is connected to the driving TFT Tr2. Also, the first auxiliary line AL1 and the second auxiliary line are in the element region DA.

The first auxiliary line AL1 is connected to a gate electrode of the auxiliary driving TFT Tr3, and the second auxiliary line is electrically connected to a source electrode 133c of the auxiliary driving TFT Tr3 via a first auxiliary pattern APn1.

Regarding the electrical connections of the electrodes of the driving TFT Tr2, the source electrode 133b of the driving TFT Tr2 is connected to the power line PL, the drain electrode 136b of the driving TFT Tr2 is connected to a drain electrode 136c of the auxiliary driving TFT Tr3 and a first portion 160a of a first electrode 160, and the gate electrode 115b of the driving TFT Tr2 is connected to a drain electrode 136a of the switching TFT Tr1.

The first auxiliary line AL1 may have the function similar to the gate line GL applying a scan voltage to a gate electrode 115a of the switching TFT Tr1, and particularly, may function as a sense line that applies a sense voltage to the gate electrode 115c of the auxiliary driving TFT Tr3.

Further, the second auxiliary line functions as a reference line that applies a common voltage as a reference voltage.

The first electrode 160 contacts the drain electrode 136b of the driving TFT Tr2 via a second drain contact hole 153, and extends from the element region DA to the light emission region EA.

The first electrode 160 as a characteristic component of the embodiment includes three portions i.e., the first portion 160a, a second portion 160b, and a third portion 160c.

The first portion 160a of the first electrode 160 is located at the element region DA and contacts the drain electrode 136b of the driving TFT Tr2. The second portion 160b is located at the light emission region EA and functions as one part of the organic light emitting diode E.

The third portion 160c of the first electrode 160 corresponding to a pixel region is located at a neighboring pixel region. For example, the third portion 160c of the first electrode 160, the first and second portions 160a and 160b of which are formed at the second pixel region P2, is located at the element region DA of the upper neighboring pixel region i.e., the first pixel region P1. Particularly, an end of the third portion 160c of the first electrode 160 belonging to the second pixel region P2 overlaps the drain electrode 136b of the driving TFT Tr2 of the first pixel region P1.

Because of the first electrode 160 having the above-described structure, even if the driving TFT Tr2 is defective and the pixel region P1 having such the driving TFT Tr2 becomes a bright spot or dark spot, a repair process may be conducted such that the third portion 160c of the first electrode 160 contacts the drain electrode 136b of the driving TFT Tr2 of the neighboring pixel region P2. Thus the defective pixel region P1 can be operated normally.

A bank 163 may be formed at a boundary portion between neighboring pixel regions P and the element region DA of each pixel region P. An organic light emitting layer 165 may be formed on the first electrode 160 corresponding to the light emission region EA surrounded by the bank 163. A second electrode 168 may be formed on the bank 163 and the organic light emitting layer 165. The second electrode 168 may be formed substantially all over the display region.

The first electrode 160, the organic light emitting layer 163, and the second electrode 168 form the organic light emitting diode E.

In the drawings, it is shown that the organic light emitting layer 163 is formed in the light emission region EA. However, it should be understood that the organic light emitting layer 163 may be formed substantially all over that the display region.

In the above explanations, it is described that the third portion 160c of the first electrode 160 of each pixel region overlaps the driving TFT Tr2 at the upper neighboring pixel region. However, in case that the positions of the element region DA and the light emission region EA of each pixel region change, the third portion 160c of the first electrode 160 of each pixel region may overlap the driving TFT Tr2 at the lower neighboring pixel region.

In the electroluminescent device 101, it is preferred that the pixel regions P on each column line along the extension direction of the data line DL emit the same color, and at least three neighboring pixel regions P on each row line along the extension direction of the gate line GL emit different colors.

In other words, the pixel regions P on each column line connected to the same data line DL emit the same color, and red, green, and blue pixel regions, or red, green, blue, and white pixel regions on each row line connected to the same gate line GL are neighboring and repeated along each row line.

Accordingly, when the pixel region P is defective, the third portion 160c of the first electrode 160 of the neighboring pixel region P can be electrically connected to the drain electrode of the driving TFT Tr2 of the defective pixel region P for repair process. Thus, the defective pixel region P can be operated identically to the neighboring pixel region. Therefore, the defective pixel region P can be operated to have the same color and brightness as the upper or lower neighboring pixel region P. Therefore, the image display can be performed almost identically to an image display when there are no defective pixel regions.

A more detailed structure of the organic electroluminescent device 101 is explained below.

For the purpose of explanation, because the switching TFT Tr1, the driving TFT Tr2, and the auxiliary driving TFT Tr3 have substantially the same cross-sectional structure, the structure of such the TFTs is explained with the driving TFT Tr2. Further, characters, "a", "b" and "c" are affixed to the end of the numerals of the gate electrodes 115, the oxide semiconductor layers 120, and the source and drain electrodes 133 and 136, belonging to the switching TFT Tr1, the driving TFT Tr2, and the auxiliary driving TFT Tr3, respectively.

Referring to FIG. 3, the driving TFT Tr2 includes the gate electrode 115b, the gate insulating layer 118, the oxide semiconductor layer 120b, the etch stopper 123 having the semiconductor contact hole 125, and the source and drain electrodes 133b and 136b which are spaced apart from each other on the etch stopper 123 and contacts the corresponding portions of the oxide semiconductor layer 120b via the corresponding semiconductor contact holes 125.

The first auxiliary line AL1 may be formed at the same layer and of the same material as the gate electrode 115b of the driving TFT Tr2, and extends along and is spaced apart from the extension direction of the gate line GL.

The data line DL may be formed at the same layer and of the same material as the source and drain electrodes 133b and 136b of the driving TFT Tr2, and crosses the gate line GL. The second auxiliary line may be spaced apart from and parallel with the data line DL.

The gate electrode 115a of the switching TFT Tr1 may be connected to the gate line GL, and the source electrode 133a of the switching TFT Tr1 may be connected to the data line DL.

A portion of the first auxiliary line AL1 functions as the gate electrode 115c of the auxiliary driving TFT Tr3. The second auxiliary line may be connected to the source electrode 133c of the auxiliary driving TFT Tr3 through the auxiliary pattern 117. The power line PL may be connected to the source electrode 133b of the driving TFT Tr2.

In the embodiment, the switching TFT Tr1, the driving TFT Tr2, and the auxiliary driving TFT Tr3 are formed in a bottom gate type. Alternatively, the switching TFT Tr1, the driving TFT Tr2, and the auxiliary driving TFT Tr3 may be formed in other type.

For example, the switching TFT Tr1, the driving TFT Tr2, and the auxiliary driving TFT Tr3 may be formed in a co-planar type using a polysilicon semiconductor. In this case, the TFTs Tr1 to Tr3 each include a semiconductor layer, which has an active region made of intrinsic polysilicon and source and drain regions at both sides of the active region made of impurity-doped polysilicon, a gate insulating layer, a gate electrode corresponding to the active region, an inter-layered insulating layer having semiconductor contact holes exposing the source and drain regions, respectively, and source and drain electrodes contacting the semiconductor layer through the semiconductor contact holes, respectively.

The co-planar type TFT further includes the inter-layered insulating layer compared with the bottom gate type TFT. In the co-planar type TFT, the gate line and the first auxiliary line may be formed on the gate insulating layer, and the data line, the power line and the second auxiliary line formed on the inter-layered insulating layer.

The power line PL may be formed at the same layer as the data line DL or the gate line.

The gate electrode 115b, the gate line GL, the data line DL, the power line PL, the source and drain electrodes 133b and 136b, the first auxiliary line AL1, and the second auxiliary line may be each formed with a single-layered or multiple-layered structure using at least one low-resistance metal material at least one of copper (Cu), copper alloy, aluminum (Al), aluminum alloy (AlNd), molybdenum (Mo), and molybdenum alloy (e.g., MoTi).

Referring to FIG. 3, a passivation layer 140 may be formed on the switching TFT Tr1, the driving TFT Tr2, and the auxiliary driving TFT Tr3, and may be made of an inorganic insulating material, for example, silicon oxide ($SiO_2$) or silicon nitride (SiNx).

The passivation layer 140 may include a first drain contact hole 143 exposing the drain electrode of the driving TFT Tr2.

A light shielding pattern 145 may be formed on the passivation layer 140 corresponding to the driving TFT Tr2 in each element region DA. The light shielding pattern 145 may contact the drain electrode 136b of the driving TFT Tr2 via the first drain contact hole 143.

The light shielding pattern 145 may be configured to substantially shield the entire separate region between the source and drain electrodes 133b and 136b; and thus, light incidence through the separate region between the source and drain electrodes 133b and 136b can be prevented.

In other words, the light shielding pattern 145 functions to block light incident on the oxide semiconductor layer 120b through the separate region between the source and drain electrodes 133b and 136b and prevent malfunction of the driving TFT Tr2 due to leakage current caused by energy absorbed from incident light.

The light shielding pattern may be formed of an opaque metal material having low resistance and light-shielding property.

It is shown in the drawings that the light shielding pattern is formed corresponding to the driving TFT Tr2. However, it should be understood that the light shielding pattern 145 may also be formed on the passivation layer 140 over the switching TFT Tr1 and the auxiliary driving TFT Tr3.

The gate electrode 115b and the drain electrode 136b overlap each other with the gate insulating layer 118 and the etch stopper 123 therebetween at a region where the oxide semiconductor layer 120b is not formed to form the storage capacitor StgC.

In the embodiment, the storage capacitor StgC may be formed at the driving TFT Tr2 but not formed at the switching TFT Tr1 and the auxiliary driving TFT Tr3.

A planarization layer 150 may be formed on the light shielding pattern 145 to cover the display region and having a substantially flat surface. The planarization layer 150 may include a second drain contact hole 153 which exposes a portion of the light shielding pattern 145 contacting the drain electrode 136b. The second drain contact hole 153 may overlap the first drain contact hole 143 in order to reduce the area of the element region DA.

Figure 4:
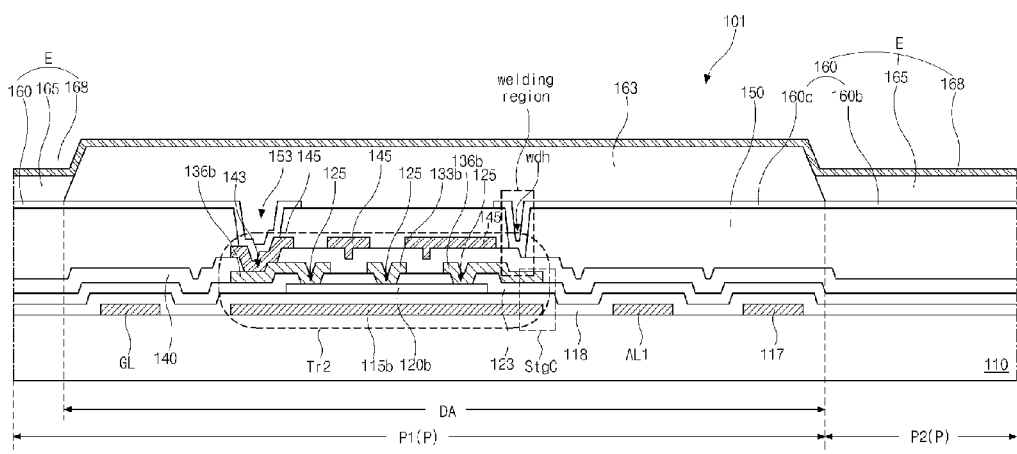
FIG. 4 is a cross-sectional view of the organic electroluminescent device according to an alternative exemplary embodiment of the present invention.

Alternatively, referring to FIG. 4 which shows a cross-sectional view of the organic electroluminescent device according to an alternative embodiment of the present invention, the planarization layer 150 may have a welding hole wdh at a portion of the drain electrode 136b of the pixel region P1 where an end of the third portion 160c of the first electrode 160 of the pixel region P2 is located.

In this case, the light shielding pattern 145 is not formed at the region where the welding hole wdh is formed, and the welding hole wdh exposes a portion of the passivation layer 140 therebelow.

Referring to FIGS. 3 and 4, the first electrode 160 may be formed on the planarization layer 150, and can be connected to the light shielding pattern 145, which is connected to the drain electrode 136b, through the second drain contact hole 153. The first electrode 160 may be made of a transparent conductive material having a high work function, for example, indium-tin-oxide (ITO) and function as an anode. The first electrode 160 includes the first to third portions 160a, 160b and 160c.

In case that the light shielding pattern 145 is not employed, the passivation layer 140 may have a drain contact hole, which may be formed at the same position and at the same shape as the first drain contact hole 143, the planarization 150 may be not employed, and the first electrode 160 may directly contact the drain electrode 136b through the drain contact hole.

The second portion 160b of the first electrode 160 may be located at the light emission region EA of each pixel region P. Here, the first portion 160a of the first electrode 160 extends from an end of the second portion 160b and is located at the element region DA of the pixel region P. The third portion 160c of the first electrode 160 extends from the other end of the second portion 160b to the element region DA of the neighboring pixel region P1 so that the third portion 160c overlaps the drain electrode 136b of the driving TFT Tr2 of the neighboring pixel region P1.

In the device 101 of the alternative embodiment, the third portion 160c of the first electrode 160 is on the passivation layer 140 and in the welding hole wdh.

The bank 163 may be formed on the first electrode 160 and at the boundary of each light emission region DA.

The bank 163 may be configured to surround each light emission region EA, overlap an edge of the second portion 160b, and expose a center portion of the first electrode 160. The bank 163 may be formed substantially all over each element region DA.

The bank may be formed of an organic insulating material, for example, polyimide, or a black material, for example, black resin.

The organic light emitting layer 165 may be formed on the second portion 160b of the first electrode 160 at the light emission region EA of each pixel region P surrounded by the bank 163.

The second electrode 168 may be formed on the organic light emitting layer 165 and the bank 163. The second electrode 168 may be formed all over the display region, or be formed in a plate shape in the display region with an opening surrounded by an electrode pattern. The second electrode 168 may function as a cathode and may be made of a metal material having a low work function, for example, at least one of aluminum (Al), aluminum alloy (e.g., AlNd or AlMg), silver (Ag), magnesium (Mg), and gold (Au).

In case that the second electrode 168 has openings, the openings may be formed at a portion of each element region DA where the driving TFT Tr2 and the third portion 160c of the first electrode 160 overlap each other. This is for easily conducting a repair process when the pixel region P has a dark defect or bright defect.

However, a process of checking whether or not the defect happens may be conducted after forming the first electrode 160 and before forming the second electrode 168. Accordingly, the second electrode 168 may be not required to have an opening, and forming the second electrode 168 all over the display region without openings is not problematic.

The first and second electrodes 160 and 168 and the organic light emitting layer 165 may form the organic light emitting diode E.

Even though not shown in the drawings, a first light emitting compensation layer may be formed between the first electrode 160 and the light emitting layer 165, and a second light emitting compensation layer may be formed between the second electrode 168 and the light emitting layer 165. Each of the first and second light emitting compensation layers may have a multiple-layered structure so as to improve light emission efficiency.

The multiple-layered first light emitting compensation layer may include a hole injection layer and a hole transporting layer sequentially formed on the first electrode 160, and the multiple-layered second light emitting compensation layer may include an electron transporting layer and an electron injection layer sequentially formed on the organic light emitting layer 165.

Alternatively, the first and second light emitting compensation layer may each have a single-layered structure. In this case, the single-layered first light emitting compensation layer may have one of the hole injection layer and the hole transporting layer, and the single-layered second light emitting compensation layer may have one of the electron injection layer and the electron transporting layer.

Further, the first light emitting compensation layer may include an electron blocking layer, and the second light emitting compensation layer may include a hole blocking layer.

In the organic electroluminescent device 101, red, green and blue color filter patterns may be formed between the passivation layer 140 and the planarization layer 150 in the light emission regions EA of the respectively pixel regions P.

In case that the color filter patterns are formed, the organic light emitting layer 165 of each pixel region P is a white organic light emitting layer emitting white. The white emitted from the organic light emitting layers passes through the respective color filter patterns and is changed into the respective colors so that full color can be displayed.

Further, a pixel region not having any color filter pattern will emit white. In this case, the organic electroluminescent device 101 uses four colors, red, green, blue, and white. Thus, contrast ratio and brightness can be improved.

Alternatively, the organic electroluminescent device 101 may not use the color filter patterns. In this case, red, green, and blue organic light emitting layers may be formed in the respective pixel regions, or red, green, blue, and white light emitting layers may be formed in the respective pixel regions.

Even though not shown in the drawings, the organic electroluminescent device 101 may include a second substrate which faces the first substrate 110 having the above-described configuration and functions to encapsulate the organic light emitting diode E. In this case, an adhesive may be formed between peripheral portions of the first substrate 110 and the second substrate to attach the first and second substrates to manufacture a display panel.

A space between the first substrate 110 and the second substrate may be in a vacuum or be filled with an inert gas.

The second substrate for encapsulation may be made of plastic having a flexible property, or glass.

Alternatively, the organic electroluminescent device 101 may not use the second substrate. For example, a film having an adhesive layer may be attached to the first substrate 110 such that the film contacts the second electrode 168, and further, an organic insulating layer or inorganic insulating layer as a capping layer may be formed on the second electrode 168.

Alternatively, an organic insulating layer or inorganic insulating layer as a capping layer may be formed on the second electrode 168, and function as an encapsulation layer instead of the second substrate.

In the organic electroluminescent device 101, because of the first electrode 160 configuration as described above, a pixel region P having a dark or bright defect can be repaired to be operated normally. Accordingly, an error rate and failure cost can be reduced, and further non-defective or error-minimized display devices can be provided.

A method of repairing the defective pixel region to be operated normally is explained as below.

Figure 5:
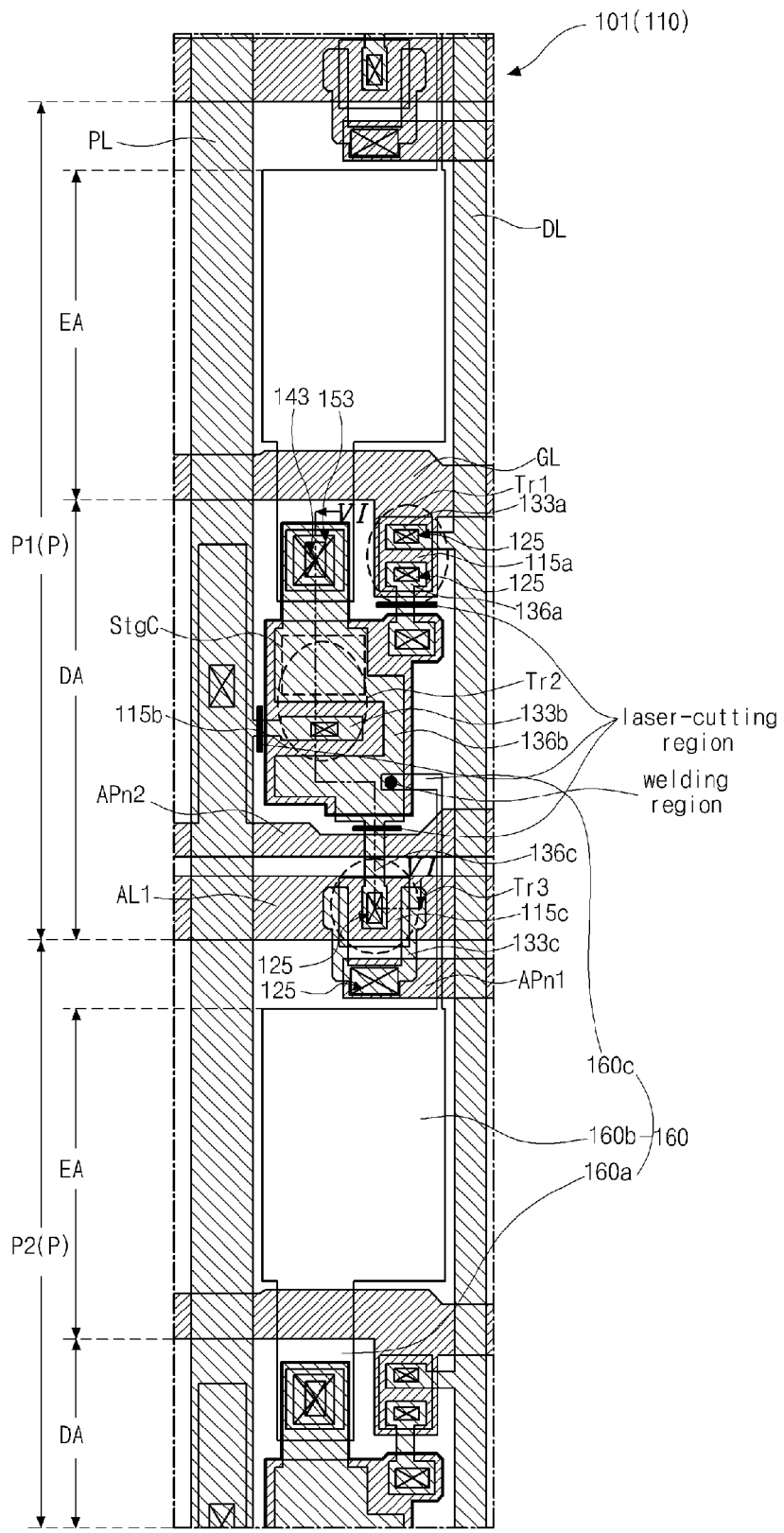
FIG. 5 is a plan view illustrating a laser-cut portion and a welding portion in a repair method, of the organic electroluminescent device according to the exemplary embodiment of the present invention.
Figure 6:
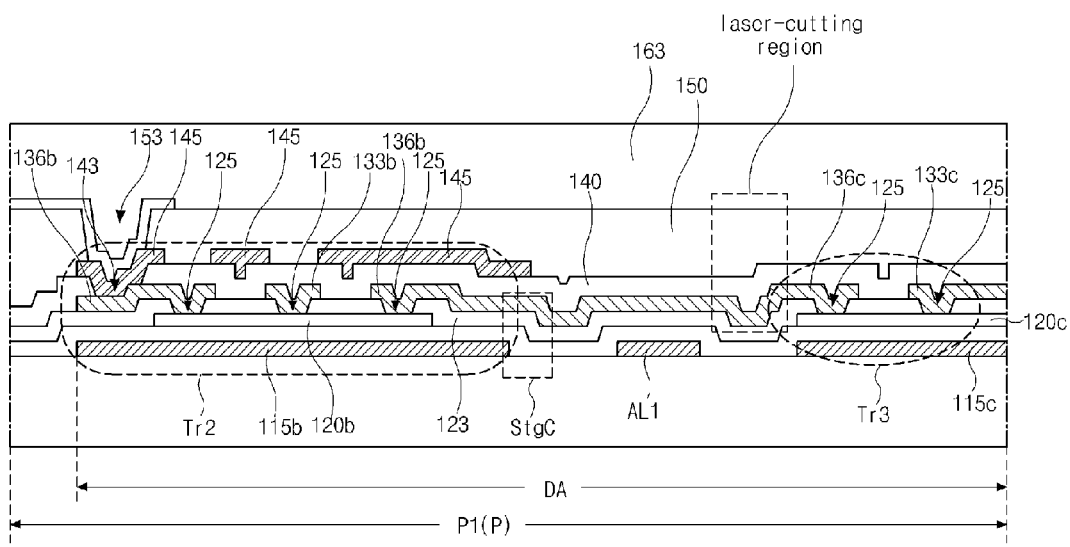
FIGS. 6 and 7 are cross-sectional views taken along a line VI-VI of FIG. 5, of the organic electroluminescent device before the laser-cut process and after the laser-cut process, respectively, according to the exemplary embodiment of the present invention.
Figure 7:
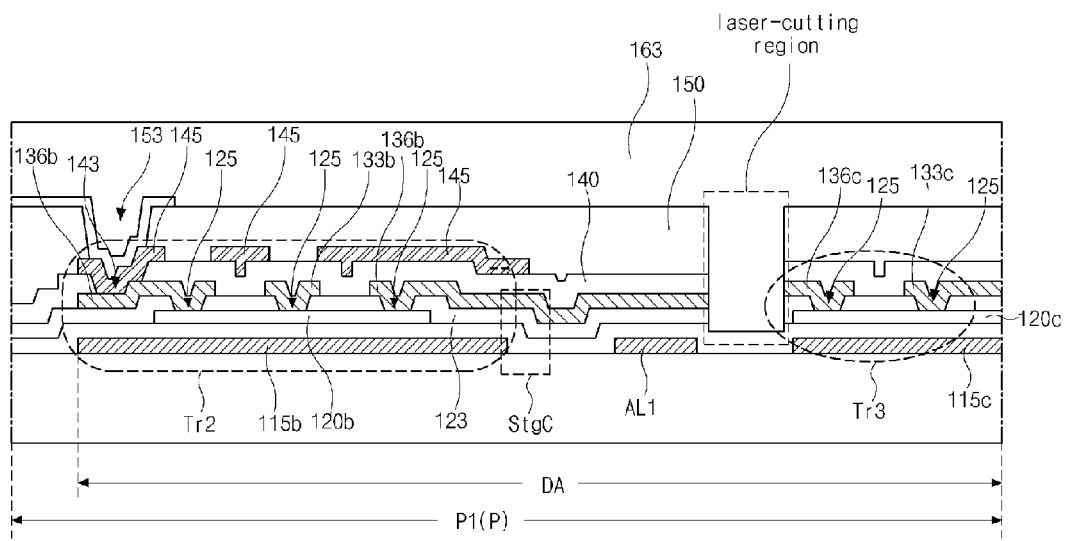
Figure 8:
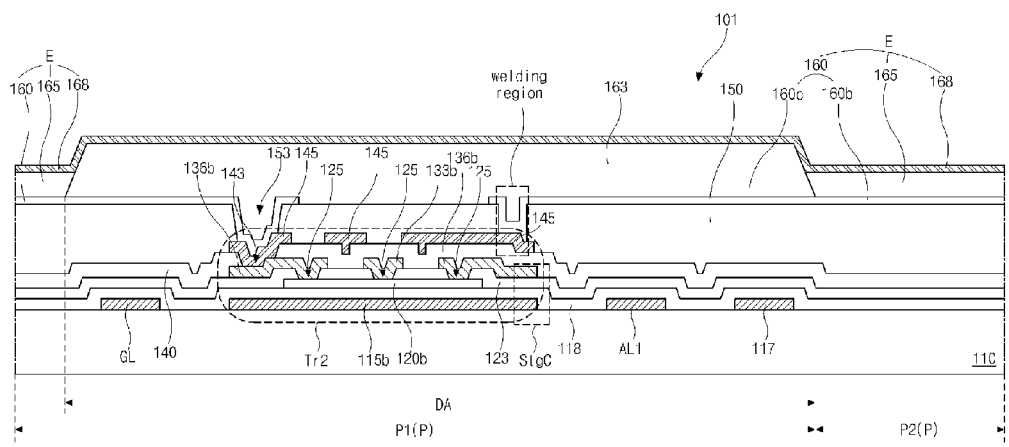
FIGS. 8 and 9 are cross-sectional views of the organic electroluminescent devices after the welding process according to the exemplary embodiment and the alternative exemplary embodiment of the present invention, respectively.
Figure 9:
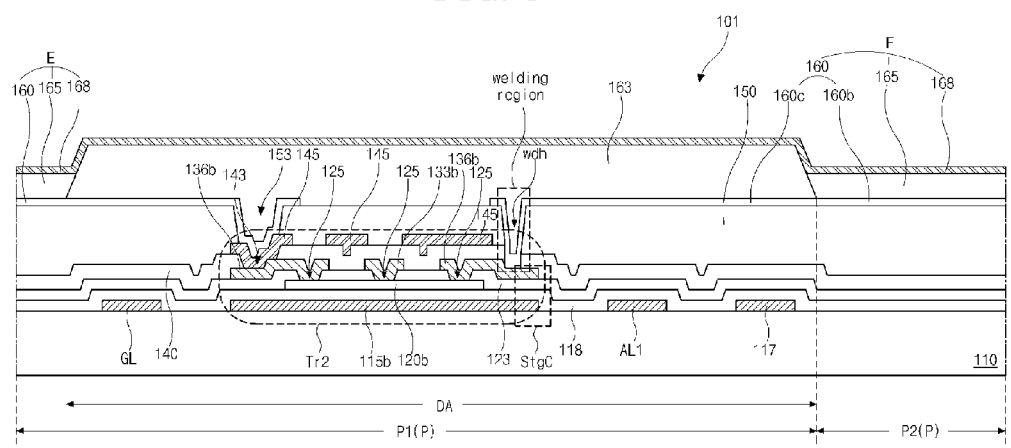

FIG. 5 is a plan view illustrating a laser-cut portion and a welding portion for repair of the organic electroluminescent device according to the embodiment of the present invention. FIGS. 6 and 7 are cross-sectional views taken along a line VI-VI of FIG. 5 showing the organic electroluminescent device before the laser-cut process and after the laser-cut process, respectively. FIGS. 8 and 9 are cross-sectional views of the organic electroluminescent devices after the welding process according to the embodiment and the alternative embodiment of the present invention, respectively. FIGS. 8 and 9 correspond to FIGS. 3 and 4, respectively.

Referring to the drawings, when the switching TFT Tr1, the driving TFT Tr2, or the auxiliary driving TFT Tr3 of a certain pixel region P and the pixel region P becomes a dark spot or bright spot, in order to disconnect the electrical connections among the TFTs Tr1 to Tr3, the connection portions among the TFTs Tr1 to Tr3 and the connection portion between the power line PL and the driving TFT Tr2 are cut.

The organic electroluminescent device of the embodiments has three TFTs Tr1 to Tr3 in each pixel region P, and thus a number of the cut portions can be three. However, in case that two TFTs are formed in each pixel region, a number of the cut portions can be two. The number of the cut portions can be the same as a number of the TFTs.

For example, in case that two TFTs i.e., a switching TFT and a driving TFT are formed in each pixel region, the connection portion between the switching TFT and the driving TFT and the connection portion between the driving TFT and the power line may be cut.

The connection portions may be cut, for example, using a laser cutting process. Accordingly, each of the connection portions may be completely cut and separated.

In FIGS. 5-7, it is shown that the connection portion between the drain electrode 136b of the driving TFT Tr2 and the drain electrode 136c of the auxiliary driving TFT Tr3, as an example of the connection portion between the driving TFT Tr2 and the auxiliary driving TFT Tr3, is cut.

After the cut process, a welding process is performed using a laser apparatus. The welding process is performed for the defective pixel region P1 i.e., the first pixel region P1.

In more detail, the third portion 160c of the first electrode of the neighboring pixel region P2 i.e., the second pixel region P2, that is not defective, is laser-irradiated to be welded to and electrically connected to the drain electrode 136b of the driving TFT Tr2 of the defective first pixel region P1.

In the organic electroluminescent device 101, shown in FIG. 8, including the light shielding pattern 145 which is located at the welding portion, the light shielding pattern 145 connected to the drain electrode 136b of the driving TFT Tr2 contacts the third portion 160c of the first electrode 160 in the welding process so that the drain electrode 136b of the driving TFT Tr2 of the defective first pixel region P1 is electrically connected to the first electrode 160 of the second pixel region P2.

In the organic electroluminescent device 101, shown in FIG. 9, including the light shielding pattern 145 which is not located at the welding portion, or including no light shielding pattern, the drain electrode 136b of the driving TFT Tr2 contacts the third portion 160c of the first electrode 160 in the welding process.

According to the laser cut process and welding process as described, the defective pixel region P1 can be operated by the driving TFT Tr2 of the neighboring pixel region P2. In other words, a signal applied to the first electrode 160 of the second pixel region P2 is supplied to the first electrode 160 of the first pixel region P1 through the drain electrode 136b of the first pixel region P1 connected to the first electrode 160 of the second pixel region P2 by the welding process. Thus the defective first pixel region P1 can be operated identically to the second pixel region P2.

Accordingly, a dark-spot or bright-spot defective pixel region P1 can become a normally operated pixel region.

As described above, because the defective pixel region can be normally operated after the repair method, a non-defective or error-minimized display device can be provided. Moreover, error rate and failure costs can be reduced, and thus, production costs can be reduced.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:
1. An organic electroluminescent device comprising:
a substrate;
a plurality of pixel regions on the substrate;
an element region within a first pixel region including a switching thin film transistor (TFT), a first driving TFT, and a storage capacitor;
an emission region within the first pixel region adjacent to the element region and including an emission layer;
a planarization layer covering the element region and the emission region, and having an entirely flat surface;
a first electrode directly on the planarization layer to contact a first surface of the emission layer; and
a second electrode contacting a second surface of the emission layer,
wherein a portion of the first electrode extends into a second pixel region adjacent to the first pixel region and overlaps a second driving TFT in an element region of the second pixel region.

2. The organic electroluminescent device of claim 1, further comprising a light shielding layer on a passivation layer.

3. The organic electroluminescent device of claim 2, wherein the first electrode overlaps a portion of the light shielding layer in the first pixel region.

4. The organic electroluminescent device of claim 2, wherein the light shielding layer overlaps a source or drain electrode of the first driving TFT.

5. The organic electroluminescent device of claim 1, further comprising a passivation layer between a first drain electrode of the first driving TFT and the planarization layer.

6. The organic electroluminescent device of claim 1, wherein the switching TFT and the first driving TFT are a bottom-gate type TFT structure.

7. The organic electroluminescent device of claim 1, further comprising an auxiliary driving TFT connected to the first driving TFT.

8. The organic electroluminescent device of claim 1, wherein the first electrode further contacts a passivation layer on the first driving TFT in the element region.

9. An organic electroluminescent device comprising:
a first substrate including a plurality of pixels each including a switching thin film transistor (TFT), a driving TFT connected to the switching TFT, and an organic light emitting diode (OLED) connected to the driving TFT; and
a second substrate encapsulating the plurality of pixels;
wherein a first electrode directly on a planarization layer contacts a first OLED in a first pixel, and
wherein the first electrode extends into a second pixel region adjacent to the first pixel region and overlaps a second driving TFT in the second pixel.

* * * * *